INTEGRATED SEMICONDUCTOR AND PN-JUNCTION CAPACITOR

Filed Sept. 20, 1968

WITNESSES

Edwin E. Bassler

James T. Young

INVENTORS
Robert C. Gallagher &
David W. Williams
BY Lee P. Johns
ATTORNEY

United States Patent Office 3,544,862
Patented Dec. 1, 1970

3,544,862

INTEGRATED SEMICONDUCTOR AND PN JUNCTION CAPACITOR

Robert C. Gallagher, Ellicott City, and David W. Williams, Baltimore, Md., assignors to Westinghouse Electric Corporation, Pittsburgh, Pa., a corporation of Pennsylvania Filed Sept. 20, 1968, Ser. No. 761,025
Int. Cl. H01l *1/16*
U.S. Cl. 317—235 4 Claims

ABSTRACT OF THE DISCLOSURE

An integrated semiconductor structure having a transistor element and a capacitor element; the capacitor element including emitter, base, and collector regions with PN junctions therebetween. The emitter region is provided with many interdigitated portions whereby a high perimeter to surface area ratio exists, and the total value of capacitance obtained from a given area is increased.

BACKGROUND OF THE INVENTION

Field of the invention

This invention relates to an improved design for integrated PN junction capacitors.

Description of the prior art

PN junctions to provide capacitors are structures whose fabrication are presently most compatible with that of bipolar transistors in integrated circuits. Evaporated films can be anodized and coated with a conductive film forming thin film capacitors. The metal oxide semiconductor (MOS) method can also be used to make capacitors. Both of these methods slightly yield higher capacitance per unit area. However, those methods require additional processing steps that are costly and reduce the overall yield of the final device.

The PN junction capacitor can be improved by paralleling the base emitter junction with the base collector junction. As a result, use of the same surface area can increase the capacitance per unit area. Using this method with a low base sheet resistivity, however, inversely affects the capacitance; i.e., the capactitance per unit area is lower than for a thin film or MOS capacitor.

Moreover, the junction capacitor varies with voltage according to the expression:

$$C \sim V - \frac{1}{n}$$

where $n$ is 2 to 3. For some particular switching applications the performance is improved because the capacitance is high when passing the front edge of a signal but then decrases as the capacitor charges. Thus the discharge time is less. Generally, the thin film and metal oxide semiconductor capacitors do not vary with applied voltage.

When designing an emitter junction of the PN junction capacitor having an increased capacitance per unit of surface area, a distinction between the surface area and the junction area is recognized. Surface area increases the size of the integrated surface and thereby results in a small number of devices per slice, thereby raising the price of the integrated circuit. The junction area includes the surface area as well as the side walls of the junction. Thus, the total junction area could be increased by increasing the junction depth. However, this has an adverse affect on the transistor design if the same diffusions are used. On the other hand, where separate diffusions are used, extra processing steps are required. The problem then is to incerase the capacitance per unit surface area without any additional processing steps.

SUMMARY OF THE INVENTION

It has been found in accordance with the invention that the foregoing problems may be overcome by increasing the capacitance per unit surface area by providing an emitter region having many interdigitated portions whereby a higher perimeter to surface area ratio exists and the total junction area 1 unit surface area is increased.

Accordingly, it is a general object of this invention to provide an integrated compatible PN junction capacitor for use on integrated circuits.

It is another object of this invention to provide a capacitor having an increased capacitance per unit area of an emitter junction without a corresponding increase in the parasitic capacitance to the substrate and without adding an extra processing step.

It is another object of this inevntion to provide a capacitor having an increased capacitance per unit surface area of an emitter junction without comprising the transistor and diffused resistor design.

Finally, it is an object of this invention to accomplish the foregoing objects and desiderata in a simple and effective manner.

Generally, the device of the present invention is an integrated semiconductor structure having a transistor element and a capacitor element, the capacitor element including emitter, base, and collector regions with PN junctions therebetween. The emitter and base regions each having a junction depth and an impurity concentration profile, the capacitor element also including first and second regions and a third region which have junction depths and impurity concentrations similar to those of the emitter and base regions. The first region having a plurality of interconnected segments in PN junction relation with said second region to provide increased junction perimeter and increased junction capacitance for a given overall area. The first and second regions are positioned in a third region of material of the same conductivity type as the first region, and electrical contact means between said first and second regions, and the third region being free of electrical contact.

BRIEF DESCRIPTION OF THE DRAWINGS

For a better understanding of the nature and objects of this invention, reference is made to the drawings, in which:

Similar numerals refer to similar parts throughout the several views of the drawings.

Referring to FIG. 1 an integrated structure is shown in a body of semiconductive material including a substrate 16 and various regions for a capacitor element and a transistor element. In the portion providing a capacitor is a first region 18 of N+ conductivity type, a second region 12 of P conductivity type, and a third region 14 of N conductivity type. The first and second regions 18 and 12, being zones of opposite type, are separated by a PN junction 20. The substrate 16 is adjacent to the third region 14 and separated by a junction 22. The first region 18 is disposed at the surface 24 of the substrate 16 remote from the junction 20. Terminals 26 and 28 contact the first region 18 and second region 12, respectively.

Figure 1:
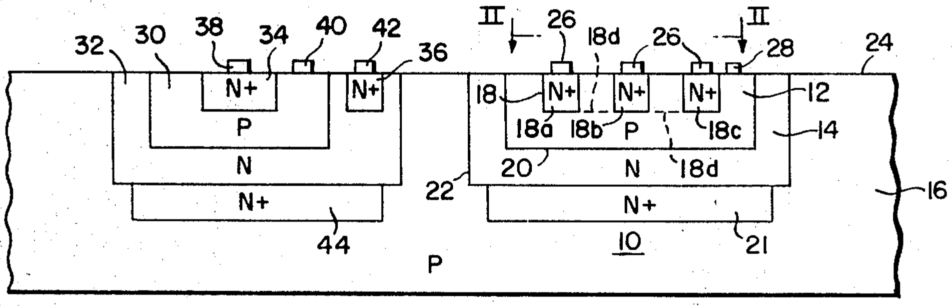
FIG. 1 is a schematic view of one form of the invention.

In another portion of the substrate 16 a bipolar transistor is provided which includes a base 30, a collector 32, and an emitter 34 similar to the first, second and fourth regions 12, 14, and 18, respectively. In addition, a fifth region 36 of N+ type material is provided in the surface 24 of the collector region 28. Contacts 38, 40, and 42 are provided for the regions 34, 30, and 36, respectively. In addition, a sixth region 44 which is a so-called "buried collector" or "floating collector" region is provided between the substrate 16 and the region 32. If desired, a region 21 similar to region 44 may be provided under the third region 14 but is not preferred.

The structure of FIG. 1, particularly as to junction depths and impurity concentrations, is dictated by the design requirements for the bipolar transistor in the left hand portion. For fabrication ease the regions in the capacitor structure are formed in the same fabrication operations by well known techniques such as those using epitaxial growth and selective diffusion. Consequently, capacitor regions 18, 12, and 14 are like regions 34, 30, and 32, respectively, in conductivity type, junction depth and impurity concentration gradient.

In order to provide a high ratio of perimeter to area the region 18 comprises a plurality of interconnected segments. The region 18 includes three leg portions 18*a*, 18*b*, and 18*c* which are interconnected by the portion 18*d*.

Figure 2:
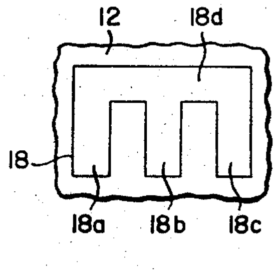
FIG. 2 is a plan view taken on the line II—II of FIG. 1.
Figure 3:
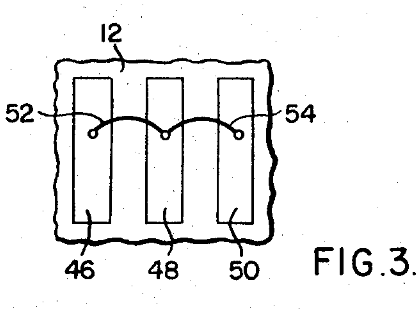
FIG. 3 is a plan view of another embodiment of the device shown in FIG. 2.

An alternate form of the region 18 is that shown in FIG. 3 which comprises at least three separate emitter regions 46, 48, and 50 which are interconnected by metallized interconnect layers 52 and 54 over the oxide instead of being provided with the common interconnecting region such as 18*d* as shown in FIG. 2. Here again, a high ratio of perimeter to area is provided by the several emitter regions 46, 48, and 50.

Figure 4:
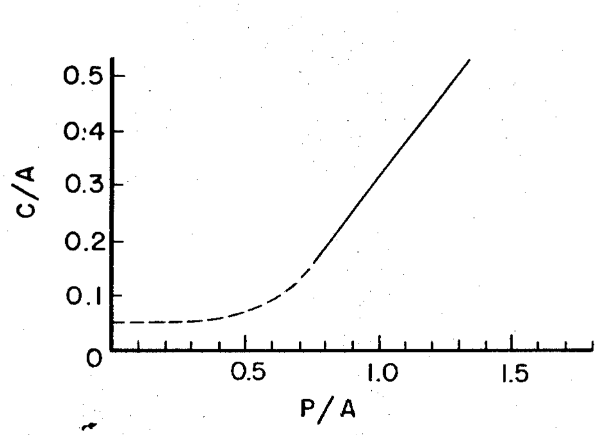
FIG. 4 is a graph showing the characteristics of capacitance per unit area versus perimeter per unit area.

The capacitance per unit surface area of an emitter junction has been measured for several surface geometries and plotted against the perimeter per unit area as shown in FIG. 4. The higher the ratio of perimeter to surface area, the higher the capacitance of the unit area. However, the larger the area, the lower the perimeter per unit area ratio. Thus, the emitter area into one or more closely spaced areas or a multitude of interconnected digitated fingers such as shown in FIGS. 2 and 3 in order to provide a high perimeter to surface area ratio.

Figure 5:
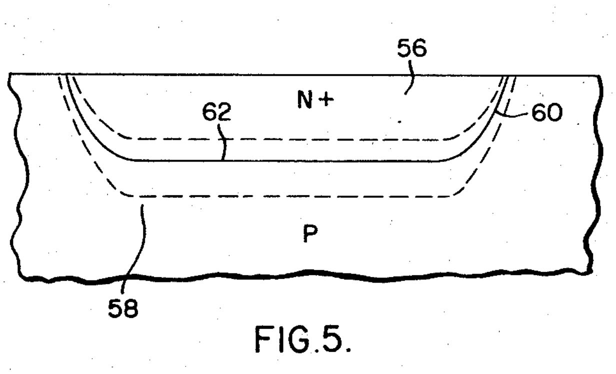
FIG. 5 is a partial sectional view of one type of a PN junction useful in understanding the invention.

The capacitance per unit surface area increases with an increase in the ratio of the perimeter to the unit surface area. As shown in FIG. 5, an emitter 56 is diffused into a graded junction, i.e., the base diffused region 58. The capacitance per unit area of a side wall area 60 is greater than that for the planar wall area 62. The results from the variation in the background concentration in the Gaussian diffused base region and the subsequent variation in the depletion width of the junction from the planar surface to the inner section with the device surface.

The improvement accrued by this technique may be calculated if the capacitance per unit area of the planar surface area 62 as well as for the side wall area 60 are known. For an emitter junction diffused into a base region 58 of 130 ohms/square and 3 microns deep the respective $C/A$ ratios are:

$C_{\text{planar area}} \leq 0.05$ pfd./mils$^2$
$C_{\text{side walls}} \geq 0.40$ pfd./mils$^2$ (average figure for graded junction side wall).

The following example is exemplary of the present invention.

EXAMPLE

A rectangular surface area of three by ten mils is compared with an interdigitated area having five legs of 0.2 mil wide and separated by 0.3 mil. An emitter having the rectangular configuration has a planar area of 30.0 square mils and a side wall area of 3.0 square mils, giving a total area of 33.0 square mils. On the other hand, an emitter having an interdigitated configuration has a surface area of 20 square mils and a side wall area of 24 square mils. Using the capacitance figures set forth in the foregoing formulas the capacitance of the rectangular and interdigitated areas is as follows:

$C$ (rectangle) $=0.05(30)+0.40(3)=2.7$ pfd.
$C$ (interdigitated) $=0.05(20)+0.40(24)=10.6$ pfd.

An improvement of about four is achieved in the foregoing example. Accordingly, it has been experimentally demonstrated that if the emitter is broken up into elongated thin legs of width 1–5 microns and separated by 5–7 microns with a high perimeter per unit area surface ratio, the capacitance per unit surface area is increased by a significant factor. One advantage of the foregoing procedure is that the increased capacitance can be obtained without any additional steps in processing and is compatible with the paralleling technique used by connecting collector and emitter junctions. Moreover, the procedure is completely compatible with monolithic integrated circuits and raises the ratio of the EC–B capacitor to the parasitic capacitor from 2 to 10 extending the frequency range usefulness.

It is understood that the above specification and drawings are merely exemplary and not in limitation of the invention.

What is claimed is:

1. An integrated circuit structure comprising: a plurality of electrically isolated device elements in a unitary body including at least one transistor element and at least one capacitor element; said transistor structure comprising emitter, base, and collector regions with PN junctions therebetween wherein said emitter and base regions each have a junction depth and an impurity concentration profile; said capacitor element comprising first and second regions wherein said first and second regions have a junction depth and an impurity concentration profile like those of said emitter and base regions respectively; said first region having a plurality of interconnected segments in PN junction relation with said second region to provide increased junction perimeter and increased junction capacitance for a given overall area; said first and second regions being positioned in a third region of material of the same conductivity type as said first region; means to make electrical contact to said first and second regions, and said third region being free of electrical contact.

2. The structure of claim 1 wherein the emitter region has a digitated configuration.

3. The structure of claim 1 wherein the PN junction between the emitter and the base region includes a planar area and side wall areas, and the side wall areas being at least equal to the planar area.

4. The structure of claim 3 wherein the side wall areas are greater than the planar area.

References Cited

UNITED STATES PATENTS

| | | | |
|---|---|---|---|
| 3,225,261 | 12/1965 | Wolf | 317—101 |
| 3,256,587 | 6/1966 | Hangstefer | 317—235X |
| 3,355,669 | 11/1967 | Avins | 317—235X |

JAMES D. KALLAM, Primary Examiner

U.S. Cl. X.R.

317—101, 234